United States Patent
Patra et al.

(10) Patent No.: US 9,477,157 B2
(45) Date of Patent: *Oct. 25, 2016

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventors: Michael Patra, Oberkochen (DE); Stig Bieling, Aalen (DE); Markus Deguenther, Aalen (DE); Frank Schlesener, Oberkochen (DE); Markus Schwab, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.
This patent is subject to a terminal disclaimer.

(21) Appl. No.: 14/696,653

(22) Filed: Apr. 27, 2015

(65) Prior Publication Data
US 2015/0234291 A1    Aug. 20, 2015

Related U.S. Application Data

(63) Continuation of application No. 13/604,296, filed on Sep. 5, 2012, now Pat. No. 9,046,786, which is a continuation of application No. PCT/EP2010/007953, filed on Dec. 28, 2010.

(51) Int. Cl.
*G03B 27/54* (2006.01)
*G03B 27/42* (2006.01)
*G03F 7/20* (2006.01)

(52) U.S. Cl.
CPC ................ *G03F 7/70158* (2013.01)

(58) Field of Classification Search
CPC ... G03F 7/20; G03F 7/70158; G03F 7/70581

USPC .............................. 355/53, 67–71
See application file for complete search history.

(56) References Cited

U.S. PATENT DOCUMENTS

| 6,563,567 B1 | 5/2003 | Komatsuda et al. |
| 7,061,582 B2 | 6/2006 | Zinn et al. |

(Continued)

FOREIGN PATENT DOCUMENTS

| EP | 1 109 067 | 6/2001 |
| EP | 1 262 836 | 12/2002 |

(Continued)

OTHER PUBLICATIONS

The International Search Report for corresponding PCT Appl No. PCT/EP2010/007953, mailed Oct. 26, 2011.

(Continued)

*Primary Examiner* — Hung Henry Nguyen
(74) *Attorney, Agent, or Firm* — Fish & Richardson P.C.

(57) ABSTRACT

An illumination system of a microlithographic projection exposure apparatus includes a light source to produce projection light beam, and a first and a second diffractive optical element between the light source and a pupil plane of the illumination system. The diffractive effect produced by each diffractive optical element depends on the position of a light field that is irradiated by the projection light on the diffractive optical elements. A displacement mechanism changes the mutual spatial arrangement of the diffractive optical elements. In at least one of the mutual spatial arrangements, which can be obtained with the help of the displacement mechanism, the light field extends both over the first and the second diffractive optical element. This makes it possible to produce in a simple manner continuously variable illumination settings.

19 Claims, 10 Drawing Sheets

(56) References Cited

U.S. PATENT DOCUMENTS

| | | | |
|---|---|---|---|
| 7,095,560 B2 * | 8/2006 | Toyoda | G03F 7/701 355/53 |
| 7,446,858 B2 * | 11/2008 | Kudo | G03B 27/42 355/71 |
| 7,570,345 B2 | 8/2009 | Reisinger et al. | |
| 9,046,786 B2 * | 6/2015 | Patra | G03F 7/70058 |
| 2004/0263977 A1 | 12/2004 | Toyoda et al. | |
| 2006/0087634 A1 | 4/2006 | Brown et al. | |
| 2008/0158528 A1 | 7/2008 | Stoeldraijer et al. | |
| 2013/0057844 A1 | 3/2013 | Patra et al. | |

FOREIGN PATENT DOCUMENTS

| WO | WO 2005/026843 | 3/2005 |
|---|---|---|
| WO | WO 2010/006687 | 1/2010 |

OTHER PUBLICATIONS

E. Delano entitled: "First-order Design and the $y$, $\bar{y}$ Diagram", Applied Optics, 1963, vol. 2, No. 12, pp. 1251-1256.

* cited by examiner

ILLUMINATION SYSTEM OF A MICROLITHOGRAPHIC PROJECTION EXPOSURE APPARATUS

CROSS-REFERENCE TO RELATED APPLICATIONS

This application is a continuation of, and claims priority under 35 USC 120 to, U.S. application Ser. No. 13/604,296, filed Sep. 5, 2012, now U.S. Pat. No. 9,046,786, which is a continuation of, and claims priority under 35 USC 120 to, international application PCT/EP2010/007953, filed Dec. 28, 2010. U.S. application Ser. No. 13/604,296 and international application PCT/EP2010/007953 are hereby incorporated by reference in their entirety.

FIELD

The disclosure generally relates to illumination systems for illuminating a mask in microlithographic exposure apparatus, and in particular to such systems in which a diffractive optical element is used to define an irradiance distribution in a pupil plane. The disclosure also relates to a method of operating such illumination systems.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. In general, at each layer of the fabrication, the wafer is first coated with a photoresist which is a material that is sensitive to radiation, such as deep ultraviolet (DUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes an illumination system for illuminating the mask, a mask stage for aligning the mask, a projection objective and a wafer alignment stage for aligning the wafer coated with the photoresist. The illumination system illuminates a field on the mask that may have the shape of a rectangular or curved slit, for example.

In current projection exposure apparatus a distinction can be made between two different types of apparatus. In one type each target portion on the wafer is irradiated by exposing the entire mask pattern onto the target portion in one go. Such an apparatus is commonly referred to as a wafer stepper. In the other type of apparatus, which is commonly referred to as a step-and-scan apparatus or scanner, each target portion is irradiated by progressively scanning the mask pattern under the projection beam along a scan direction while synchronously moving the substrate parallel or anti-parallel to this direction.

It is to be understood that the term "mask" (or reticle) is to be interpreted broadly as a patterning mechanism. Commonly used masks contain transmissive or reflective patterns and may be of the binary, alternating phase-shift, attenuated phase-shift or various hybrid mask type, for example. However, there are also active masks, e.g. masks realized as a programmable mirror array. Also programmable LCD arrays may be used as active masks.

As the technology for manufacturing microstructured devices advances, there are ever increasing demands also on the illumination system. Ideally, the illumination system illuminates each point of the illuminated field on the mask with projection light having a well defined irradiance and angular distribution. The term angular distribution describes how the total light energy of a light bundle, which converges towards a particular point in the mask plane, is distributed among the various directions of the rays that constitute the light bundle.

The angular distribution of the projection light impinging on the mask is usually adapted to the kind of pattern to be projected onto the photoresist. For example, relatively large sized features may involve a different angular distribution than small sized features. The most commonly used angular distributions of projection light are referred to as conventional, annular, dipole and quadrupole illumination settings. These terms refer to the irradiance distribution in a pupil plane of the illumination system. With an annular illumination setting, for example, only an annular region is illuminated in the pupil plane. Thus there is only a small range of angles present in the angular distribution of the projection light, which means that all light rays impinge obliquely with similar angles onto the mask.

Different ways are known for modifying the angular irradiance distribution of the projection light in the mask plane so as to achieve the desired illumination setting. In the simplest case a stop (diaphragm) including one or more apertures is positioned in a pupil plane of the illumination system. Since locations in a pupil plane translate into angles in a Fourier related field plane such as the mask plane, the size, shape and location of the aperture(s) in the pupil plane are involved in determining the angular distributions in the mask plane. However, any change of the illumination setting involves a replacement of the stop. This can make it difficult to finely adjust the illumination setting, because this would typically involve a very large number of stops that have aperture(s) with slightly different sizes, shapes or locations. Furthermore, the use of stops inevitably results in light losses and thus reduces the throughput of the apparatus.

Light losses caused by stops are avoided if diffractive optical elements are used to produce a specific irradiance distribution in the pupil plane of the illumination system. The irradiance distribution can be modified, at least to a certain extent, by adjustable optical elements such as zoom lenses or a pair of axicon elements that are arranged between the diffractive optical element and the pupil plane.

Flexibility in producing different irradiance distributions in the pupil plane can be increased by using mirror arrays instead of the diffractive optical elements. For example, EP 1 262 836 A1 proposes the use of a mirror array that is realized as a microelectromechanical system (MEMS) including more than 1000 microscopic mirrors. Each of the mirrors can be tilted in two different planes perpendicular to each other. Thus radiation incident on such a mirror device can be reflected into (substantially) any desired direction of a hemisphere. A condenser lens arranged between the mirror array and the pupil plane translates the reflection angles produced by the mirrors into locations in the pupil plane. This prior art illumination system makes it possible to illuminate the pupil plane with a plurality of spots, wherein each spot is associated with one particular microscopic mirror and is freely movable across the pupil plane by tilting this mirror.

Similar illumination systems are known from US 2006/0087634 A1, U.S. Pat. No. 7,061,582 B2, WO 2005/026843 A2 and WO 2010/006687.

However, in general, the use of mirror arrays is technologically demanding and involves sophisticated optical, mechanical and computational solutions.

A simpler approach to produce continuously variable irradiance distributions in the pupil plane is the use of diffractive optical elements having position dependent diffractive effects. Depending on the position where the projection light impinges on the element, different irradiance distributions are produced in the pupil plane. Usually the projection light beam will be kept fixed and the diffractive optical element is displaced with the help of a displacement mechanism so as to change the position where the projection light beam impinges on the element. Diffractive optical elements of this kind are commercially available from Tessera Technologies, Inc., San Jose, USA.

However, the flexibility to produce different irradiance distributions in the pupil plane can be quite restricted with such diffractive optical elements. Generally, at most there are two available degrees of freedom that can be used to modify this irradiance distribution, namely moving the diffractive optical element along one direction and moving it along an orthogonal direction. Displacing the diffractive optical element along the optical axis generally has very little effect on the irradiance distribution.

SUMMARY

Even with the additional flexibility provided by displaceable optical elements such as zoom lenses and axicon elements, it remains desirable to provide increased flexibility to produce continuously variable irradiance distributions in the pupil plane.

The disclosure provides an illumination system which makes it possible to produce continuously variable irradiance distributions in a pupil plane of the illumination system in a simple manner. The disclosure also provides a method of operating an illumination system of a microlithographic projection exposure apparatus which enables an operator to produce continuously variable irradiance distributions in a pupil plane of the illumination system in a simple manner.

In one aspect, the disclosure provides an illumination system of a microlithographic projection exposure apparatus including a light source which is configured to produce a projection light beam, a pupil plane, an optical axis and first and a second diffractive optical elements. The diffractive optical elements are arranged between the light source and the pupil plane such that an irradiance distribution of projection light in the pupil plane depends on diffractive effects produced by the diffractive optical elements. The diffractive effect produced by each diffractive optical element depends on the position of a light field that is irradiated by the projection light beam on the diffractive optical elements. The illumination system further includes a displacement mechanism which is configured to change the mutual spatial arrangement of the diffractive optical elements. In at least one of the mutual spatial arrangements, which can be obtained with the help of the displacement mechanism, the light field extends both over the first and the second diffractive optical element.

The disclosure is based on the concept that the range of possible irradiance distributions can be considerably increased if the projection light beam impinges on not only one, but on two or more diffractive optical elements at a given instant. The irradiance distribution in the pupil plane will then depend on the mutual spatial arrangement of the diffractive optical elements. Since at least one degree of freedom is associated with each diffractive optical element, the disclosure provides at least two independent degrees of freedom to vary the irradiance distribution in the pupil plane.

This does not necessarily imply that the displacement mechanism is capable of displacing each diffractive optical element independently. If the illumination system includes a beam steering device that is configured to change the position of the light field if the diffractive optical elements are momentarily stationary, it suffices to configure the displacement mechanism such that it is capable of displacing only one of the two diffractive optical elements relative to the other which remains at a fixed position. Such a beam steering device may include an actuator that is configured to tilt, to displace or to deform an optical element, in particular a lens or a mirror.

In many cases it will be advantageous if the displacement mechanism is a motor driven mechanism which is configured to change the mutual spatial arrangement of the diffractive optical elements in response to an input command from a control unit of the illumination system. The term "motor" should be understood broadly. It encompasses any kind of actuating device using an external energy source and includes electric, pneumatic or piezoelectric motors, for example. With a motor driven mechanism the irradiance distribution in the pupil plane can be varied very quickly without a need to manually adjust the diffractive optical elements. In principle, however, the displacement mechanism may also be a manually driven mechanism which is configured to change the mutual spatial arrangement of the diffractive optical elements when an operator manually operates a lever or any other kind of operating element that is mechanically connected to the diffractive optical elements.

If the projection light beam propagates parallel to the optical axis of the illumination system, the displacement mechanism should be configured to displace at least one diffractive optical element along a displacement direction which is perpendicular or at least not parallel to the optical axis. Only then a displacement of the at least one diffractive optical element will have the desired effect that the position of the light field that is irradiated by the projection light beam on the at least one diffractive optical element is changed.

Under such conditions the diffractive effects produced by the at least one diffractive optical element should vary depending on the position of the light field along the displacement direction.

If the diffractive optical elements are substantially planar elements, they may extend in the same plane or in parallel planes.

In most embodiments the first and the second diffractive optical element are arranged such that in at least one, preferably in all, mutual spatial arrangements, which can be obtained with the help of the displacement mechanism, projection light that impinges on the first diffractive optical element does not impinge on the second diffractive optical element. In other words, there will generally be projection light that impinges on the first diffractive optical element and projection light that impinges on the second diffractive optical element, but no projection light that impinges on both diffractive optical elements. Then the combined irradiance distribution in the pupil plane will be a superposition of the irradiance distributions that are produced individually by those portions of the first and the second diffractive optical element that lie within the light field.

If in at least one of the mutual spatial arrangements, which can be obtained with the help of the displacement mechanism, projection light that impinges on the first diffractive optical element also impinges on the second diffractive optical element, the combined irradiance distribution in the pupil plane will—for the overlapping portion of the two diffractive optical elements—not be a superposition, but a convolution of the individual irradiance distributions produced by the first and the second diffractive optical element. By changing the mutual spatial arrangement of the first and the second optical element it is possible to modify this convolution as desired.

In one embodiment the first and the second diffractive optical elements are identical. The diffractive effect produced by each diffractive optical element varies, depending on the position of the light field, exclusively along one displacement direction. One of the diffractive optical elements is mounted in an orientation that is obtained by rotating the diffractive optical element by 180° around an axis that is parallel to the optical axis.

With two diffractive optical elements having such mirror symmetrical diffractive effects there is only one degree of freedom, and consequently the flexibility to produce different irradiance distributions in the pupil plane is reduced. However, in such an embodiment small changes of the position of the light field along the displacement direction have very little effect on the irradiance distribution in the pupil plane, because variations of the diffractive effect produced by one diffractive optical element are compensated by counter effects produced by the other diffractive optical element.

This is important in those cases in which the position of the light field cannot be sufficiently stabilized. Oscillatory movements of the light field can be caused by lasers that are used as light sources in the illumination systems. The direction and also the divergence of the light emitted by the laser are not perfectly stable, and over the long distance of the beam delivery path (up to 20 meters) even very small fluctuations result in significant shifts of the light field over the diffractive optical elements. With a mirror symmetrical arrangement of the diffractive optical elements, the sensitivity of the irradiance distribution in the pupil plane against such fluctuations is significantly reduced.

In order to suppress adverse effects caused by such fluctuations also along the direction which is perpendicular to the displacement direction, it is usually sufficient to design the diffractive optical elements such that the light field has a height perpendicular to the optical axis and to the displacement direction that is at least 5%, preferably at least 20%, smaller than the sum of the height of the first and the second diffractive optical element.

In some embodiments the illumination system is configured such that the spatial arrangement of the diffractive optical elements relative to the projection light beam can be changed along two orthogonal directions that do not include the optical axis. To change the spatial arrangement of the diffractive optical elements relative to the projection light beam either the diffractive optical elements themselves can be displaced with the help of the displacement mechanism, or the projection light beam is moved, for example by changing its propagation direction using a beam steering device. In both cases it is possible to vary the areas of the portions on the diffractive optical elements over which the light field extends at a given instant. This, in turn, influences the ratio of the light energy which is distributed among the diffractive optical elements.

For example, in at least one mutual spatial arrangement the light field extends over a first portion of the first diffractive optical element and over a second portion of the second diffractive optical element, wherein the areas of the first and the second portion are different. Assuming that the projection light beam has a symmetric irradiance distribution across its diameter, the amount of light which impinges on the first and the second diffractive optical element will then be different. Consequently also the irradiance distributions associated with each diffractive optical element will contain different amounts of light energy.

The displacement mechanism may also be configured to displace the diffractive optical elements individually along two orthogonal directions that do not include the optical axis.

In some embodiments the diffractive effect produced by the first diffractive optical element results in an irradiance distribution in the pupil plane having the shape of an annulus, wherein the width of the annulus depends on the position of the light field on the first diffractive optical element. The diffractive effect produced by the second diffractive optical element results in an irradiance distribution in the pupil plane including two poles, wherein the size of the poles depends on the position of the light field on the second diffractive optical element. If the light field extends over the first and also the second diffractive optical element, the combined effect will be a superposition of an annular and a dipole illumination setting.

There may be at least one additional optical element that is arranged between the diffractive optical elements and the pupil plane. A further displacement mechanism may be provided that is configured to displace the at least one optical element along an optical axis of the illumination system. The optical element may be formed by a lens or an axicon element, for example. Then it is possible to modify the irradiance distribution in the pupil plane by additionally moving one or more of the optical elements along the optical axis, as it is known as such in the prior art.

The illumination system may also include a third diffractive optical element. Then there may be at least one mutual spatial arrangement in which the light field extends over the first, the second and also the third diffractive optical element. The result in the pupil plane will be a superposition of the irradiance distributions that are produced by the first, the second and the third diffractive optical element.

In one aspect, the disclosure provides an illumination system of a microlithographic projection exposure apparatus including a light source which is configured to produce a projection light beam, a pupil plane, an optical axis and first and a second diffractive optical elements. The diffractive optical elements are arranged between the light source and the pupil plane such that an irradiance distribution of projection light in the pupil plane depends on diffractive effects produced by the diffractive optical elements. The diffractive effect produced by each diffractive optical element depends on the position where projection light impinges on the diffractive optical elements. The illumination system further includes a displacement mechanism which is configured to change the mutual spatial arrangement of the diffractive optical elements. In at least one of the mutual spatial arrangements, which can be obtained with the help of the displacement mechanism, projection light that has impinged on the first diffractive optical element also impinges on the second diffractive optical element.

The illumination system according to this aspect of the disclosure is based on the same general conception as outlined above. The range of possible irradiance distributions can be considerably increased if the projection light beam impinges subsequently on two or more diffractive optical elements. The irradiance distribution in the pupil plane can then be described as a convolution of the individual irradiance distributions produced by the first and the second diffractive optical element. By changing the mutual spatial arrangement of the first and the second optical element it is possible to modify this convolution as desired. Since at least one degree of freedom is associated with each diffractive optical element, the disclosure according to this aspect also provides at least two independent degrees of freedom to vary the irradiance distribution in the pupil plane.

In one aspect, the disclosure provides a method which includes:
a) providing an illumination system including
i) a pupil plane,
ii) an optical axis,
iii) a first and a second diffractive optical element, wherein
the diffractive optical elements are arranged between a light source and the pupil plane such that an irradiance distribution of projection light in the pupil plane depends on diffractive effects produced by the diffractive optical elements, and wherein
the diffractive effect produced by each diffractive optical element depends on the position of a light field that is irradiated by a projection light beam on the respective diffractive optical element;
b) producing the projection light beam;
c) changing the mutual spatial arrangement of the diffractive optical elements;
wherein in at least one of the mutual spatial arrangements the light field extends both over the first and the second diffractive optical element.

The advantages of the method correspond to those noted above with respect to the illumination system.

At least one diffractive optical element may be displaced along a displacement direction which is perpendicular, or at least not parallel, to the optical axis.

The diffractive effect produced by the at least one diffractive optical element may vary, depending on the position of the light field, along the displacement direction.

The spatial arrangement of the diffractive optical elements relative to the light field may be changed along two orthogonal directions that do not include the optical axis. This may be achieved by displacing the diffractive optical elements along two orthogonal directions that do not include the optical axis.

Then, in at least one mutual spatial arrangement, the light field may extend over a first portion of the first diffractive optical element and over a second portion of the second diffractive optical element, wherein the areas of the first and the second portion are different.

The light field may be moved by steering the projection light beam using a beam steering device.

The illumination system may include a third diffractive optical element, and there may be at least one mutual spatial arrangement in which the light field extends over the first, the second and the third diffractive optical element.

In one aspect, the disclosure provides a method which includes:
a) providing an illumination system including
i) a pupil plane,
ii) an optical axis,
iii) a first and a second diffractive optical element, wherein
the diffractive optical elements are arranged between a light source and the pupil plane such that an irradiance distribution of projection light in the pupil plane depends on diffractive effects produced by the diffractive optical elements, and wherein
the diffractive effect produced by each diffractive optical element depends on the position of a light field that is irradiated by a projection light beam on the respective diffractive optical element;
b) producing a projection light beam;
c) changing the mutual spatial arrangement of the diffractive optical elements;
wherein in at least one of the mutual spatial arrangements, which can be obtained with the help of the displacement mechanism, projection light that has impinged on the first diffractive optical element also impinges on the second diffractive optical element.

DEFINITIONS

The term "light" is used herein to denote any electromagnetic radiation, in particular visible light, UV, DUV, VUV and EUV light and X-rays.

The term "light ray" is used herein to denote light whose path of propagation can be described by a line.

The term "light bundle" is used herein to denote a plurality of light rays that have a common origin in a field plane.

The term "light beam" is used herein to denote all the light that passes through a particular lens or another optical element.

The term "position" is used herein to denote the location of a reference point of a body or an immaterial object (such as light) in the three-dimensional space. The position is usually indicated by a set of three Cartesian coordinates. The orientation and the position therefore fully describe the placement of a body in the three-dimensional space.

The term "direction" is used herein to denote the spatial orientation of a straight line. A movement of an object along a specific direction thus implies that the object is allowed to move in two opposite senses on that line.

The term "surface" is used herein to denote any plane or curved surface in the three-dimensional space. The surface may be part of a body or may be completely separated therefrom, as it is usually the case with a field or a pupil plane.

The term "field plane" is used herein to denote a plane that is optically conjugate to the mask plane.

The term "pupil plane" is used herein to denote a plane in which marginal rays passing through different points in the mask plane intersect. As usual in the art, the term "pupil plane" is also used if it is in fact not a plane in the mathematical sense, but is slightly curved so that, in the strict sense, it should be referred to as pupil surface.

The term "optical raster element" is used herein to denote any optical element, for example a lens, a prism or a diffractive optical element, which is arranged, together with other identical or similar optical raster elements so that each optical raster element is associated with one of a plurality of adjacent optical channels.

The term "optical integrator" is used herein to denote an optical system that increases the product NA·a, wherein NA is the numerical aperture and a is the area of the illuminated field.

The term "condenser" is used herein to denote an optical element or an optical system that establishes (at least approximately) a Fourier relationship between two planes, for example a field plane and a pupil plane.

The term "conjugated plane" is used herein to denote planes between which an imaging relationship is established. More information relating to the concept of conjugate planes are described in an essay E. Delano entitled: "First-order Design and the y, ȳ Diagram", Applied Optics, 1963, vol. 2, no. 12, pages 1251-1256.

The term "spatial irradiance distribution" is used herein to denote how the total irradiance varies over a real or imaginary surface on which light impinges. Usually the spatial irradiance distribution can be described by a function $I_s(x, y)$, with x, y being spatial coordinates of a point on the surface. If applied to a field plane, the spatial irradiance distribution necessarily integrates the irradiances produced by a plurality of light bundles.

The term "angular irradiance distribution" is used herein to denote how the irradiance of a light bundle varies depending on the angles of the light rays that constitute the light bundle. Usually the angular irradiance distribution can be described by a function $I_a(\alpha, \beta)$, with $\alpha, \beta$ being angular coordinates describing the directions of the light rays.

BRIEF DESCRIPTION OF THE DRAWINGS

Various features and advantages of the present may be more readily understood with reference to the following detailed description taken in conjunction with the accompanying drawings in which.

DESCRIPTION OF PREFERRED EMBODIMENTS

I. General Construction of Projection Exposure Apparatus

Figure 1:
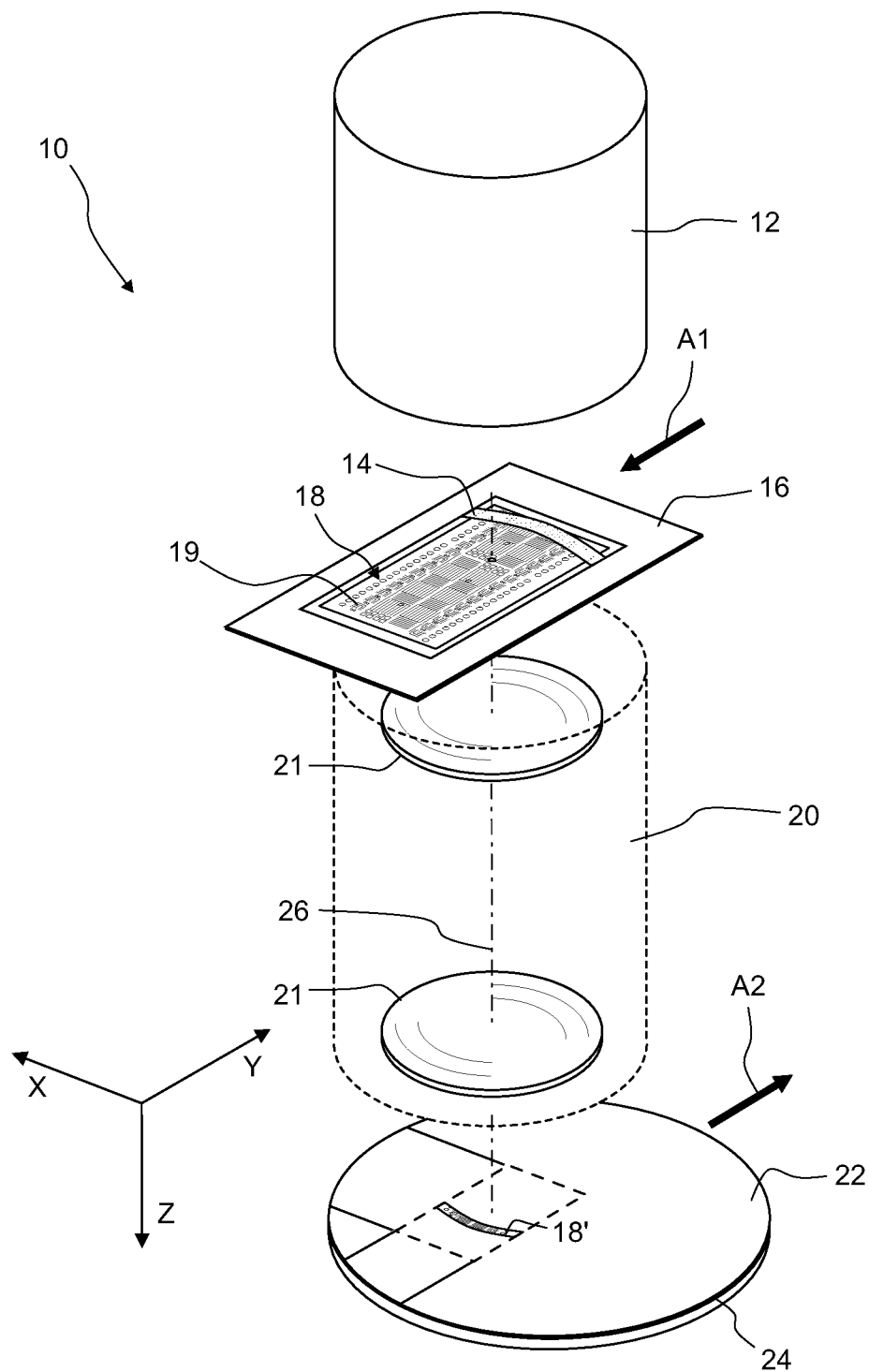
FIG. 1 is a schematic perspective view of a projection exposure apparatus in accordance with one embodiment of the present disclosure.

FIG. 1 is a perspective and highly simplified view of a projection exposure apparatus 10 in accordance with the present disclosure. The apparatus 10 includes an illumination system 12 which produces a projection light beam (not shown). The latter illuminates a field 14 on a mask 16 containing a pattern 18 formed by a plurality of small features 19 that are schematically indicated in FIG. 1 as thin lines. In this embodiment the illuminated field 14 has the shape of a ring segment. However, other shapes of the illuminated field 14, for example rectangles, are contemplated as well.

A projection objective 20 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. The projection objective 20 has a magnification with an absolute value of less than one. Accordingly, a minified image 18' of the pattern 18 within the illuminated field 14 is projected onto the light sensitive layer 22.

In this embodiment the design of the projection objective 20 the illuminated field 14 is positioned off the optical axis 26 of the projection objective 20. With other types of projection objectives, the illuminated field 14 may be centered on the optical axis 26.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification of the projection objective 20. If the projection objective 20 inverts the image (has a magnification with a value of less than zero), the mask 16 and the substrate 24 move in opposite senses, as this is indicated in FIG. 1 by arrows A1 and A2. However, the present disclosure may also be used in stepper tools in which the mask 16 and the substrate 24 do not move during projection of the mask.

II. General Construction of Illumination System

Figure 2:
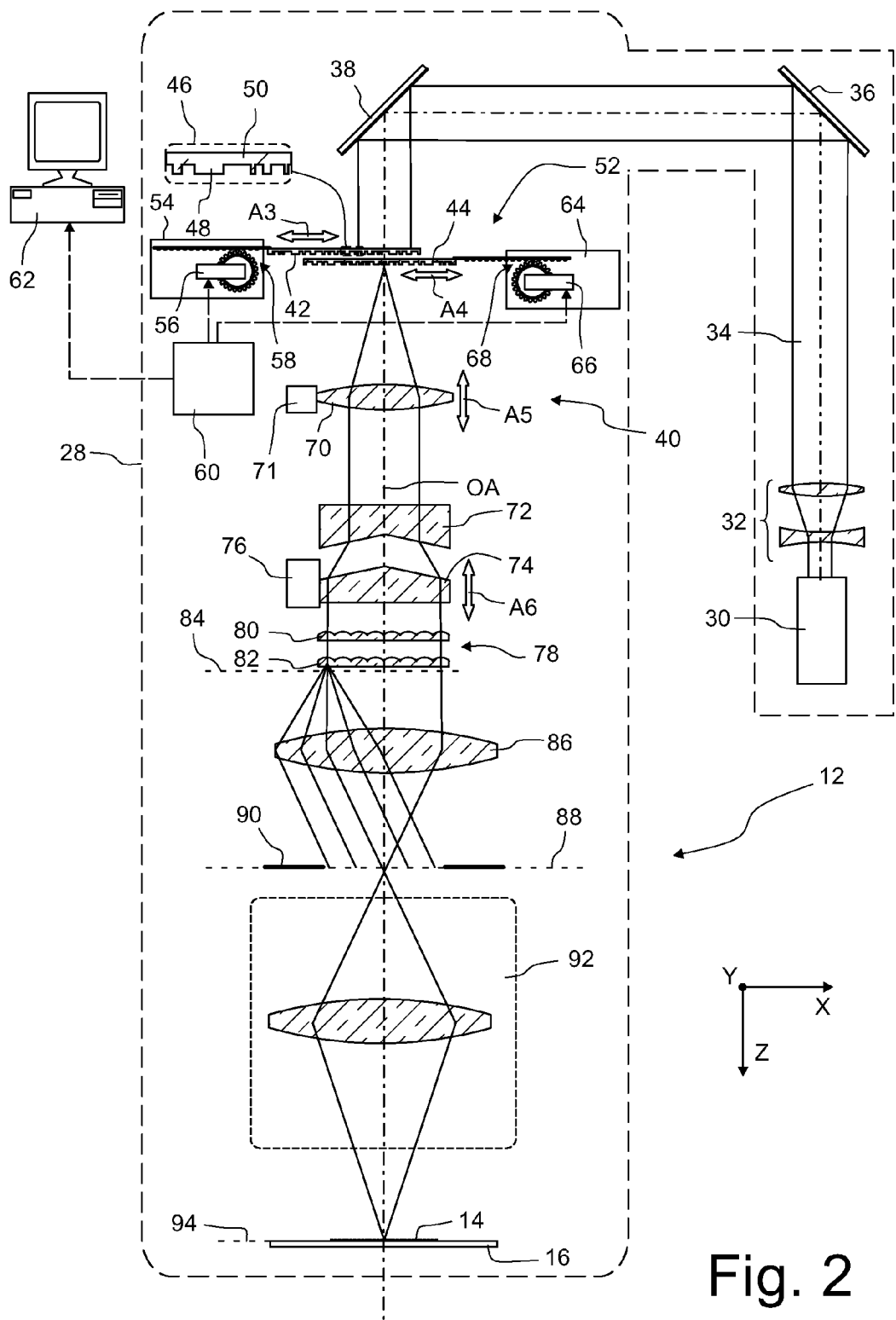
FIG. 2 is a meridional section through an illumination system of the apparatus shown in FIG. 1 according to a first embodiment.

FIG. 2 is a meridional section through the illumination system 12 shown in FIG. 1. For the sake of clarity, the illustration of FIG. 2 is considerably simplified and not to scale. This particularly implies that different optical units are represented by one or very few optical elements only. In reality, these units may include significantly more lenses and other optical elements.

The illumination system 12 includes a housing 28 and a light source 30 that is, in the embodiment shown, realized as an excimer laser. The light source 30 emits projection light having a wavelength of about 193 nm. Other types of light sources 30 and other wavelengths, for example 248 nm or 157 nm, are also contemplated.

In the embodiment shown, the projection light emitted by the light source 30 enters a beam expansion unit 32 which outputs an expanded and almost collimated projection light beam 34. In order to increase the diameter of the projection light beam, the beam expansion unit 32 may include several lenses or may be realized as a mirror arrangement, for example.

After having been deflected at a first planar beam path folding mirror 36 and a second planar beam path folding mirror 38, the projection light beam 34 enters a pupil defining unit 40 that is used to produce variable spatial irradiance distributions in a subsequent pupil plane. To this end the pupil defining unit 40 includes a first diffractive optical element 42 and a second diffractive optical element 44.

As can best be seen in the enlarged cut-out 46, each of the diffractive optical elements 42, 44 includes a plurality of minute diffractive structures 48 that are formed on a common planar substrate 50. The diffractive optical elements 42, 44 may be realized as computer generated holograms (CGH), as it is known in the art as such. The optical properties of the first and the second diffractive optical element 42, 44 will be explained further below with reference to FIGS. 3 and 4.

The diffractive optical elements 42, 44 extend in planes that are orthogonal to an optical axis OA of the illumination system 12. In this embodiment the two planes are slightly displaced along the optical axis OA, but it may also be envisaged to arrange the diffractive optical elements 42, 44 in a common plane. As it will become clear from FIG. 5, which shows the two diffractive optical elements 42, 44 if viewed along the Z direction to which the optical axis OA is parallel, the two diffractive optical elements 42, 44 are arranged in such a manner that they do not overlap, but are immediately contiguous to each other along the Y direction.

The pupil defining unit 40 further includes a displacement mechanism 52 that is configured to change the mutual spatial arrangement of the diffractive optical elements 42, 44 by displacing the diffractive optical elements 42, 44 individually along the X direction. To this end the displacement mechanism 52 includes a first driver 54 that is configured to displace the first diffractive optical element 42 along the X direction, as it is indicated by a double arrow A3. In this embodiment the first driver 54 includes a servo motor 56 which is connected to the first diffractive optical element 42 by a toothed gearing 58. The servo motor 56 is controlled by a control unit 60 which is connected to an overall system control 62.

The displacement mechanism 52 further includes a second driver 64 that is associated with the second diffractive optical element 44 in a similar manner. The second driver 64 is configured to displace the second diffractive optical element 44 along the X direction, as it is indicated by a double arrow A4. Similar to the first driver 54, the second driver 64 includes a servo motor 66 that is connected to the second diffractive optical element 44 by a toothed gearing 68. Also the servo motor 66 of the second displacement mechanism 64 is connected to the control unit 60.

In this way the mutual spatial arrangement of the first and the second diffractive optical element 42, 44 can be changed in response to an input command from the control unit 60.

The pupil defining unit 40 also includes a zoom collimator lens 70, which can be displaced along the optical axis OA with the help of a first actuator 71 (see double arrow A5), and a first and a second axicon element 72, 74 having complementary conical surfaces. The distance between the axicon elements 72, 74 along the optical axis OA can be changed with the help of a second actuator 76, as it is indicated by a double arrow A6. In this embodiment the second actuator 76 is coupled only to the second axicon element 74; other configurations to change the distance between the two axicon elements 72, 74 are also feasible. The axicon elements 72, 74 have the effect that an irradiance distribution at the entrance surface of the first axicon element 72 is radially shifted outwardly. The amount of radial shift depends on the distance between the first axicon element 72 and the second axicon element 74.

Light having passed the axicon elements 72, 74 impinges on an optical integrator 78 which includes, in the embodiment shown, two arrays 80, 82 of optical raster elements. Each optical raster element is formed by crossing two cylindrical lenses, as it is known in the art as such. The optical raster elements may also be formed by rotationally symmetric lenses having a rectangular borderline, for example. The optical integrator 78 produces in a pupil plane 84 a plurality of secondary light sources. Each secondary light source is associated with an optical channel which is defined by two optical raster elements of the arrays 80, 82 having the same X and Y coordinates.

A condenser 86 transforms the angular light distribution produced by the secondary light sources into a spatial irradiance distribution at a subsequent intermediate field plane 88. Since all secondary light sources produce substantially the same angular irradiance distribution, also the spatial irradiance distributions in the intermediate field plane 88 are very similar. The superpositions of these irradiance distributions results in a very homogenous illumination of a field in the intermediate field plane 88.

The intermediate field plane 88 is imaged, together with a field stop 90, by a field stop objective 92 onto a mask plane 94 in which the mask 16 is arranged. The field 14 illuminated on the mask 16 is thus an image of the field which is illuminated in the intermediate field plane 88 by the plurality of secondary light sources and which is masked by the field stop 90.

III. Optical Properties of Diffractive Optical Elements

In the following the optical properties of the first and the second diffractive optical element 42, 44 will be explained in more detail with reference to FIGS. 3 and 4.

Figure 3:
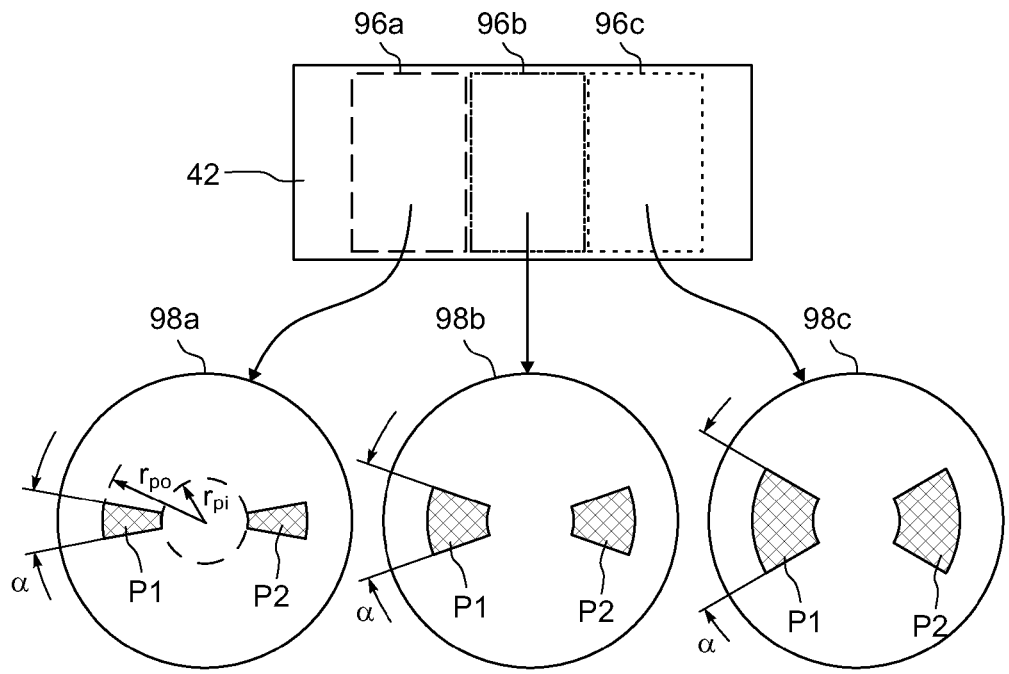
FIG. 3 shows in its upper portion a top view of a first diffractive optical element contained in the illumination system shown in FIG. 2 and in its lower portion three irradiance distributions that are produced in the far field by the first diffractive optical element if irradiated with a light field at different positions.

FIG. 3 shows in its upper portion a top view of the first diffractive optical element 42. The diffractive structures 48, which are not shown for the sake of simplicity, of the first diffractive optical element 42 are designed such that the diffractive effect produced by the first diffractive optical element 42 depends on the position of a light field that is irradiated by the projection light beam 34 on the first diffractive optical element 42.

In FIG. 3 a first, a second and a third position of such a light field are shown and denoted by 96a, 96b and 96c, respectively. The three positions 96a, 96b, 96c differ from one another only with respect to their location along the X direction.

If the projection light beam 34 irradiates a light field at the first position 96a on the first diffractive optical element 42, it will produce an angular light distribution which corresponds in the far field (or after Fourier transformation by the zoom collimator lens 70, which is equivalent) to a first spatial irradiance distribution which is denoted in FIG. 3 by 98a. In this first spatial irradiance distribution 98a only two small poles P1, P2 are illuminated that are spaced apart along the X direction. Each pole P1, P2 has the shape of a segment of a ring having an outer radius $r_{po}$ and an inner radius $r_{pi}$. The angular extension of the ring segment, which will be referred to in the following as pole width angle α, is identical for both poles P1, P2.

If the projection light beam 34 produces a light field at the second position 96b on the first diffractive optical element 42, a similar spatial irradiance distribution will be produced in the far field, but with poles P1, P2 having a larger pole width angle α. In the third position 96c of the light field the pole width angle α has its maximum value.

It is to be understood that in all intermediate positions of the light field similar poles P1, P2 will be produced, but with pole width angles α having values which are between those that are indicated in FIG. 3 for the three positions 96a, 96b and 96c.

In this embodiment the different positions 96a, 96b, 96c illustrated in FIG. 3 are not produced by moving the projection light beam 34 over the fixed first diffractive optical element 42, but by displacing, with the help of the first driver 54, the first diffractive optical element 42 relative to the fixed projection light beam 34.

Figure 4:
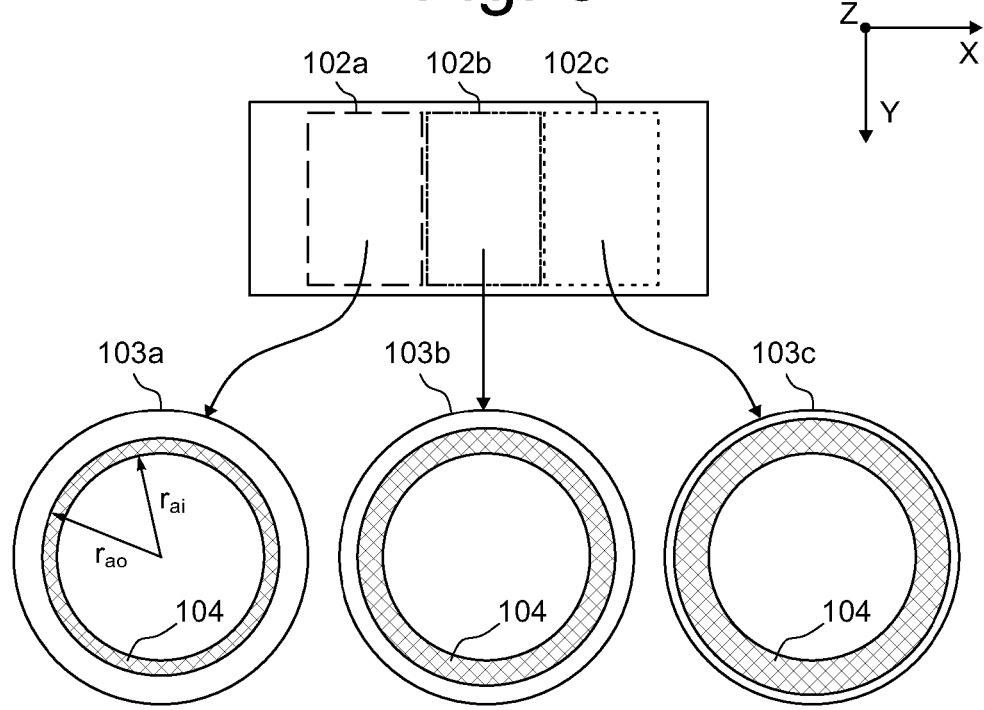
FIG. 4 shows in its upper portion a top view of a second diffractive optical element contained in the illumination system shown in FIG. 2 and in its lower portion three irradiance distributions that are produced in the far field by the second diffractive optical element if irradiated with a light field at different positions.

FIG. 4 shows, in a similar representation as FIG. 3, different spatial irradiance distributions 103a, 103b, 103c that are produced in the far field, if a light field is irradiated on the second diffractive optical element 44 at different X positions 102a, 102b, 102c. In a first position 102a of the light field an annulus 104 having an outer radius $r_{ao}$ and an inner radius $r_{ai}$ is irradiated. If the light field is moved along the X direction (position 102a), the outer radius $r_{ao}$ of the annulus 104 continuously increases until it reaches its maximum value shown for the third position 102c.

In the following the function of the illumination system 12 will be explained with reference to FIGS. 5 and 6.

IV. Function

Figure 5:
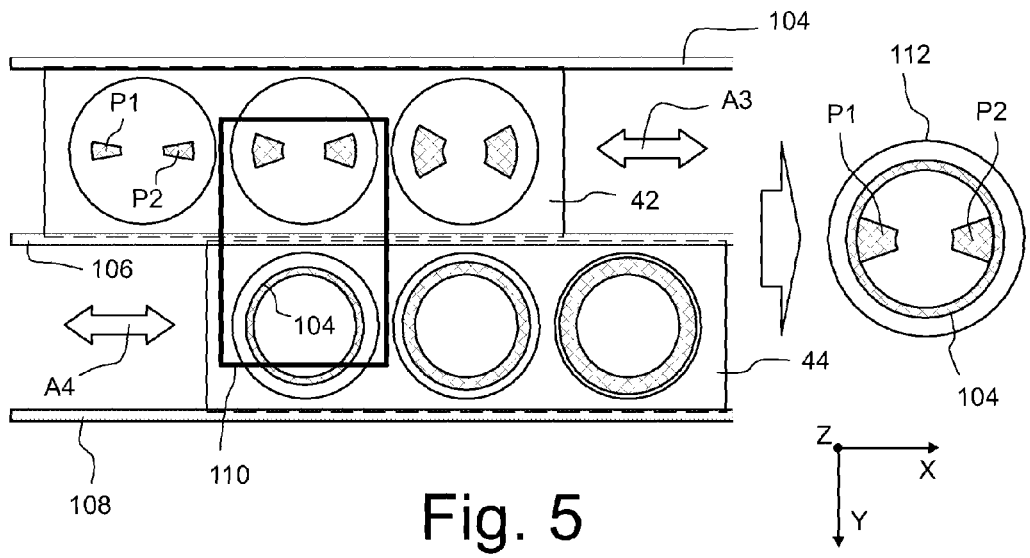
FIG. 5 is a top view on the first and the second diffractive optical element if viewed along the optical axis in a specific mutual arrangement.

FIG. 5 is a top view on the first and the second diffractive optical element 42, 44 if viewed along the Z direction which is parallel to the optical axis OA. The diffractive optical elements 42, 44 are guided in guide rails 104, 106, 108 so that they can be individually displaced with the help of the first and the second driver 54, 64 (not shown in FIG. 5) along the X direction.

In each diffractive optical element 42, 44 the far field irradiance distributions are schematically indicated which will be produced if light impinges on the respective X position of the diffractive optical elements 42, 44. The two diffractive optical elements 42, 44 are arranged in the beam path of the projection light beam 34 such that the latter irradiates on the diffractive optical elements 42, 44 a light field 110 which extends equally to both diffractive optical elements 42, 44. In other words, one half of the light beam 34 (if one disregards the small light losses produced by the middle guiding rail 106) is diffracted by the first diffractive optical element 42, and the other half of the light beam 34 is diffracted by the second diffractive optical element 44.

In the specific mutual spatial arrangement of the first and the second diffractive optical element 42, 44 which is shown in FIG. 5, the first diffractive optical element 42 produces in the far field two light poles P1, P2 having a medium sized pole width angle α. The second diffractive optical element 44 produces in the far field a thin annulus 104 having a small outer radius $r_{ao}$. Since both far field irradiance distributions simply superimpose, a combined irradiance distribution 112 is obtained which is a combination of the thin annulus 104 with the two medium sized poles P1, P2.

By changing the mutual spatial arrangement of the first and the second diffractive optical element 42, 44, the thickness of the annulus 104 and the pole width angle α can be independently varied. More specifically, if the first diffractive optical element 42 is moved along the X direction with the help of the first driver 54, as it is indicated by the arrow A3, the pole width angle α continuously changes. If the second diffractive optical element 44 is moved along the X direction with the help of the second driver 64, as it is indicated by the arrow A4, the outer radius of the annulus 104 continuously changes.

Figure 6:
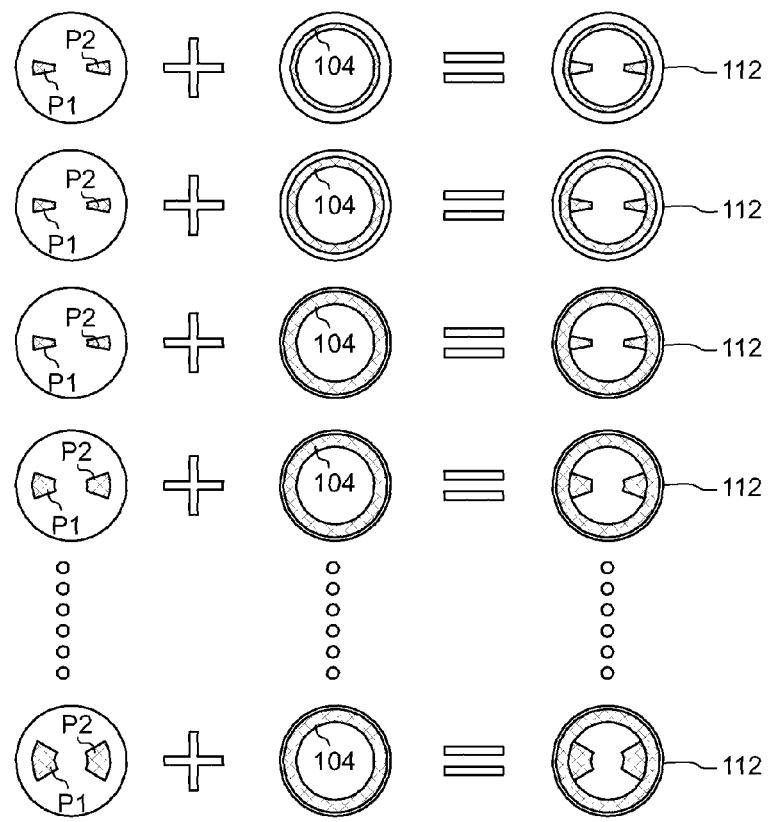
FIG. 6 shows a plurality of different combined irradiance distributions that can be obtained with different mutual spatial arrangements of the first and the second diffractive optical element.

This is illustrated also in FIG. 6 which shows a plurality of different combined irradiance distributions 112 that can be obtained with different mutual spatial arrangements of the first and the second diffractive optical element 42, 44. In the first three rows of FIG. 6 it has been assumed that the first diffractive optical element 42 shown in FIG. 5 has been moved to the right such that the light field 110 extends over a portion of the first diffractive optical element 42 which produces in the far field poles P1, P2 having the smallest pole width angle α. This spatial irradiance distribution is combined with different annuli 104 that are produced in the far field by moving the second diffractive optical element 44 shown in FIG. 5 to the left. Then the geometry and size of the poles P1, P2 in the combined irradiance distribution 112 is kept fixed, while the outer radius $r_{ao}$ of the annulus 104 continuously increases.

Depending on the mutual spatial arrangement of the first and the second diffractive optical element 42, 44 any arbitrary combination of pole width angle α and outer radius $r_{ao}$ of the annulus 104 can be obtained.

Each combined irradiance distribution 112 that can be obtained using the two diffractive optical elements 42, 44 can be further varied with the help of the zoom collimator lens 64 and the axicon elements 72, 74. If the zoom collimator lens 64 is displaced along the optical axis OA, this will have the effect of magnifying or minifying the combined irradiance distribution 112 that is produced by the diffractive optical elements 42, 44 in their instant spatial arrangement. In other words, the irradiance distribution is scaled up or scaled down by a constant factor. This entails, for example, that if the outer radius $r_{ao}$ of the annulus 104 is increased by a factor of x, also its inner radius $r_{ai}$ is increased by a factor x.

With the help of the axicon elements 72, 74 the annulus 104 and the poles P1, P2 can be moved radially without changing their radial size. This entails, for example, that if the outer radius $r_{ao}$ of the annulus 104 is increased by a factor of x, its inner radius $r_{ai}$ becomes $r_{ai}+r_{ao}(x-1)$.

The illumination system 12 thus provides 4 degrees of freedom, namely the X positions of the first and the second diffractive optical element 42, 44, the Z position of the zoom collimator lens 64 and the Z position of the second axicon element 74, to adjust the irradiance distribution in the pupil plane 84 so as to image the mask 16 in the best possible way on the light sensitive surface 22.

V. Second Embodiment

Figure 7:
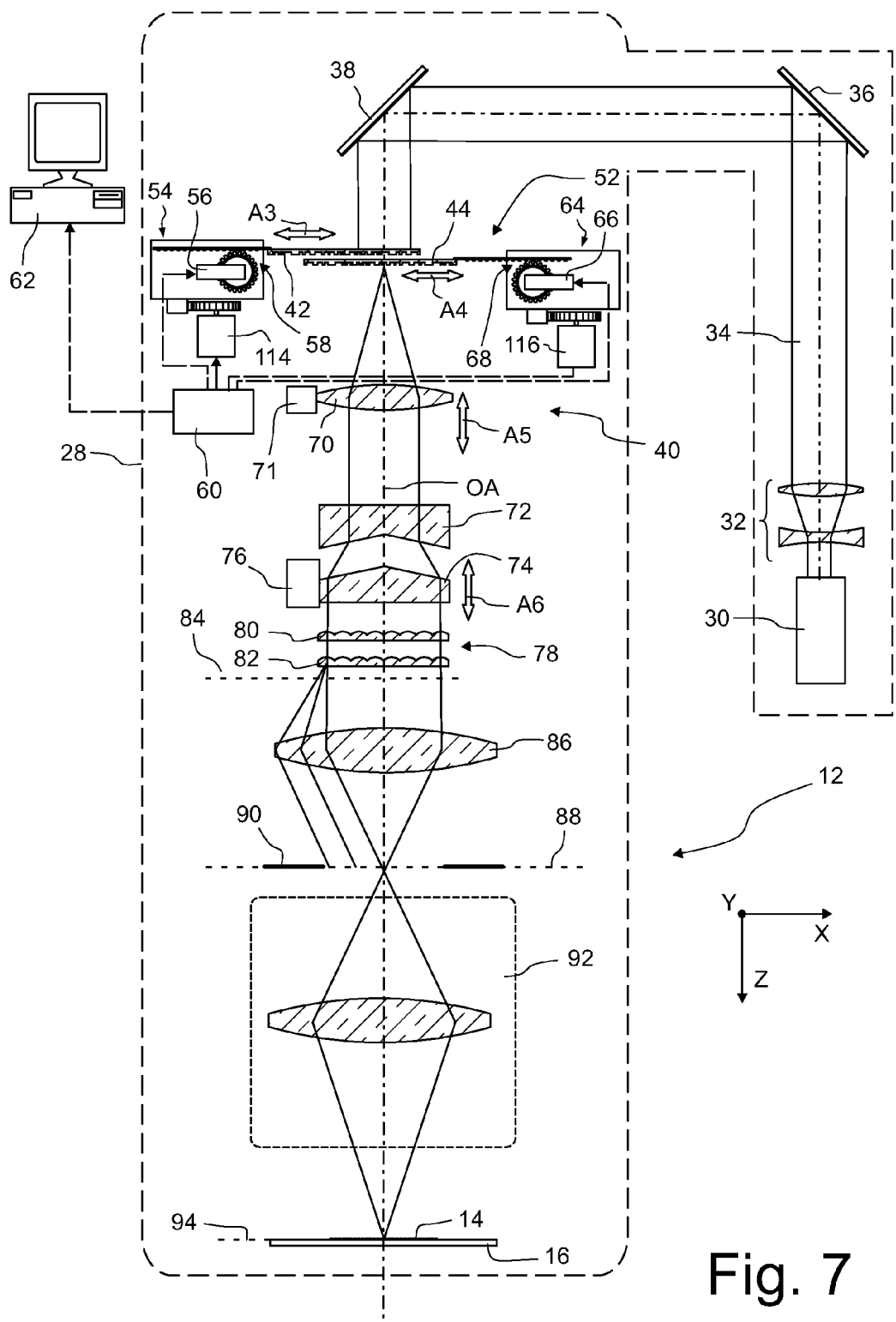
FIG. 7 is a meridional section through an illumination system of the apparatus shown in FIG. 1 according to a second embodiment in which the diffractive optical elements can be displaced along two orthogonal directions.

FIG. 7 is a meridional section through an illumination system 12 according to a second embodiment in a representation similar to FIG. 2.

The illumination system 12 shown in FIG. 7 differs from the illumination system shown in FIG. 2 mainly in that the first and the second driver 54, 64 are configured to displace the diffractive optical elements 42, 44 not only along the X direction, but also along the Y direction. The X and the Y directions are orthogonal to each other but do not include the optical axis OA.

To this end the drivers 54, 64 include additional servo motors 114, 116 that are capable of displacing the first and the second diffractive optical element 42, 44, together with the servo motors 56, 66 and the toothed gearings 58, 68, along the Y direction.

The effect of being able to displace the first and the second diffractive optical element 42, 44 also along the Y direction will be explained in the following with reference to FIGS. 8a, 8b and 8c.

Figure 8A:
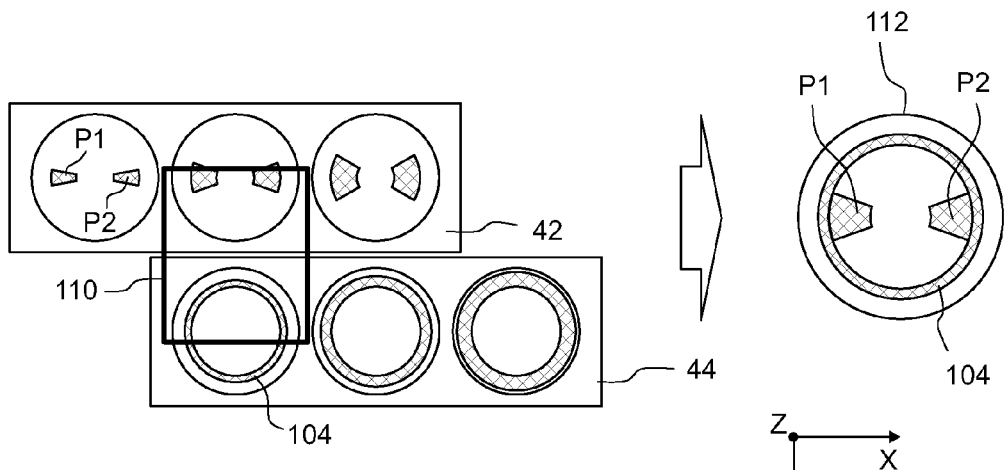
FIGS. 8a to 8c are top views on the first and the second diffractive optical element if viewed along the optical axis in a specific mutual arrangement, but with different relative positions with respect to the projection light beam.

FIG. 8a is substantially identical to FIG. 5. The first and the second diffractive optical element 42, 44 are arranged relative to the light field 110 such that the portions irradiated on the first and the second diffractive optical element 42, 44 have at least substantially the same area. Consequently the same amount of light is directed towards the poles P1, P2 as to the annulus 104 in the combined irradiance distribution 112.

Figure 8B:
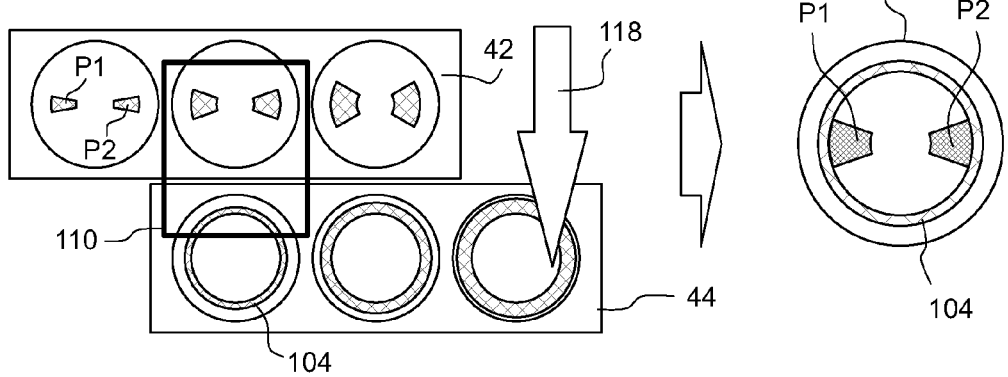

In FIG. 8b it has been assumed that the two diffractive optical elements 42, 44 have been displaced downward, as it is indicated by arrow 118, i.e. along the Y direction. Consequently, the arrangement of the first and the second diffractive optical element 42, 44 relative to the light field 110 is changed so that the portions irradiated on the first and the second diffractive optical element 42, 44 by the projection light beam 34 now have different areas. As a result more than one half of the available light is directed by the first diffractive optical element 42 towards the poles P1, P2, and less than one half of the available light is directed by the second diffractive optical element 44 towards the annulus 104. In other words, light energy is shifted from the annulus 104 to the poles P1, P2 in the combined irradiance distribution 112.

Figure 8C:
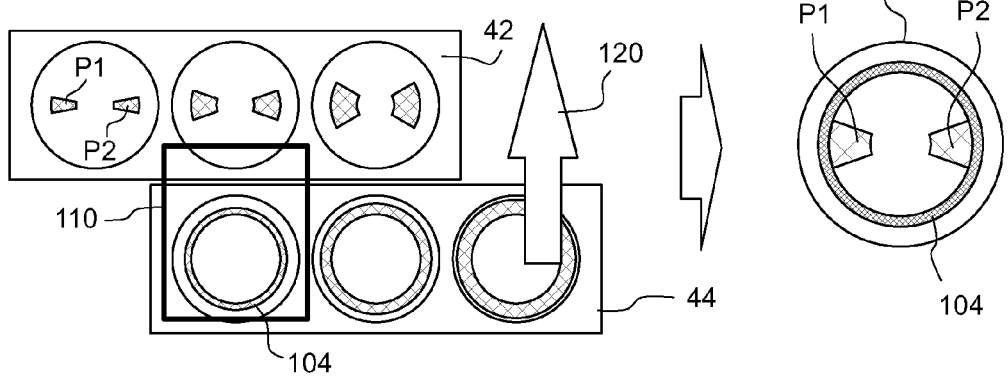

If the two diffractive optical elements 42, 44 are commonly moved upwards along the Y direction, as it is indicated by an arrow 120 in FIG. 8c, most projection light will be directed towards the annulus 104, and the poles P1, P2 are only weakly irradiated in the pupil plane 84.

By changing the Y position of the diffractive optical elements 42, 44 it is thus possible to continuously vary the light energy ratio of the available light that is directed towards the poles P1, P2 and the light that is directed towards the annulus 104.

The ability to change the light energy ratio between the annulus 104 and the poles P1, P2 by moving the diffractive optical elements 42, 44 along the Y direction is particularly advantageous if not only the position, but also the areas of the far field irradiance distributions produced by each diffractive optical element 42, 44 are changed with movements of the diffractive optical elements 42, 44 along the X direction. For example, if the size of the poles P1, P2 shall be increased by increasing the poles width angle α, it may be desirable to keep the irradiance at each point in the poles P1, P2 constant. Then light energy can be transferred from the annulus 104 to the poles P1, P2 to such an extent that the irradiance in the poles P1, P2 remains constant irrespective of the pole width angle α.

VI. Further Alternative Embodiments a) Changing Beam Direction

Figure 9:
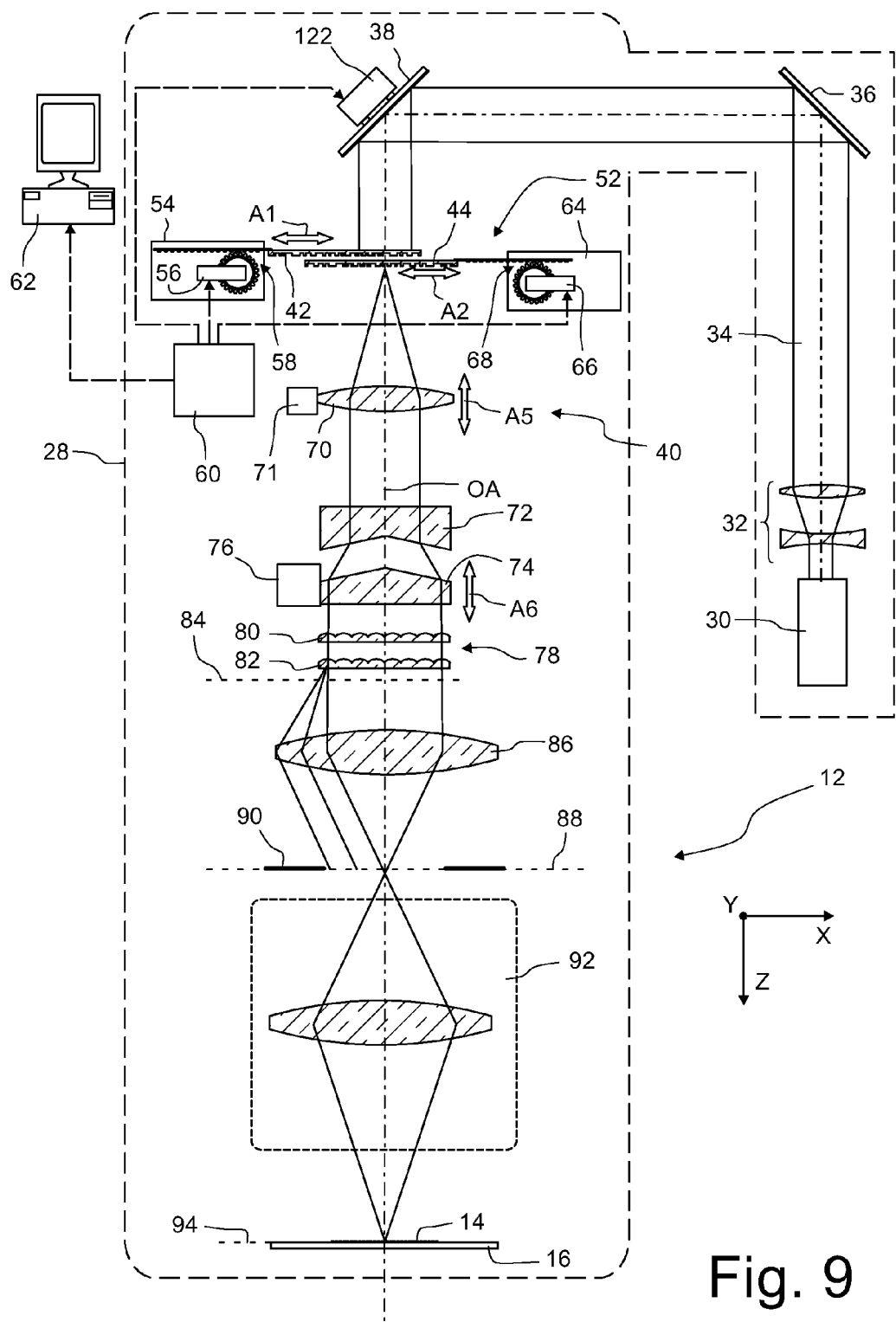
FIG. 9 is a meridional section through an illumination system of the apparatus shown in FIG. 1 according to a third embodiment in which the spatial arrangement of the diffractive optical elements relative to the projection light beam can be varied by a beam steering device.

FIG. 9 is a meridional section through an illumination system 12 according to a third embodiment in which it is also possible to change the spatial arrangement of the diffractive optical element 42, 44 relative to the light field 110 along the X and Y direction. However, in this embodiment the first and the second drivers 54, 64 are, similar to the embodiment shown in FIG. 2, only capable to displace the diffractive optical elements 42, 44 along the X direction so as to change their mutual spatial arrangement. The change of the arrangement of the diffractive optical elements 42, 44 relative to the light field 110 along the Y direction is produced in this embodiment by a beam steering device including an actuator 122. The latter is capable of tilting the second beam folding mirror 38 such that the projection light beam 34, and thus the light field 110 irradiated by the light beam 34 on the diffractive optical elements 42, 44, moves along the Y direction up and down as desired. Then the sizes of the poles P1, P2 and the annulus 104 are determined by the mutual spatial arrangement of the first and the second diffractive optical element 42, 44 along the X direction. The light energy ratio is determined by moving the light field 110 up and down with the help of the actuator 122.

This concept of aiming the light beam 34 to a desired position on the diffractive optical elements 42, 44 using the actuator 122 helps to keep the mechanical layout of the first and the second driver 54, 64 simple.

Since tilting the second beam folding mirror 38 inevitably changes the direction of projection light beam 34 impinging on the diffractive optical elements 42, 44, it may be preferred to configure the actuator 122 such that it is capable of displacing the second beam folding mirror 38 along the X direction. If the diffractive optical elements 42, 44 and the drives 54, 64 are mounted in a orientation which is obtained from the arrangement shown in FIG. 9 by rotating these components by 90° about optical axis OA, the same effect is achieved as in the embodiment shown in FIG. 9, but the projection light beam 34 always impinges under the same angle on the diffractive optical elements 42, 44.

b) Three Diffractive Optical Elements

Figure 10:
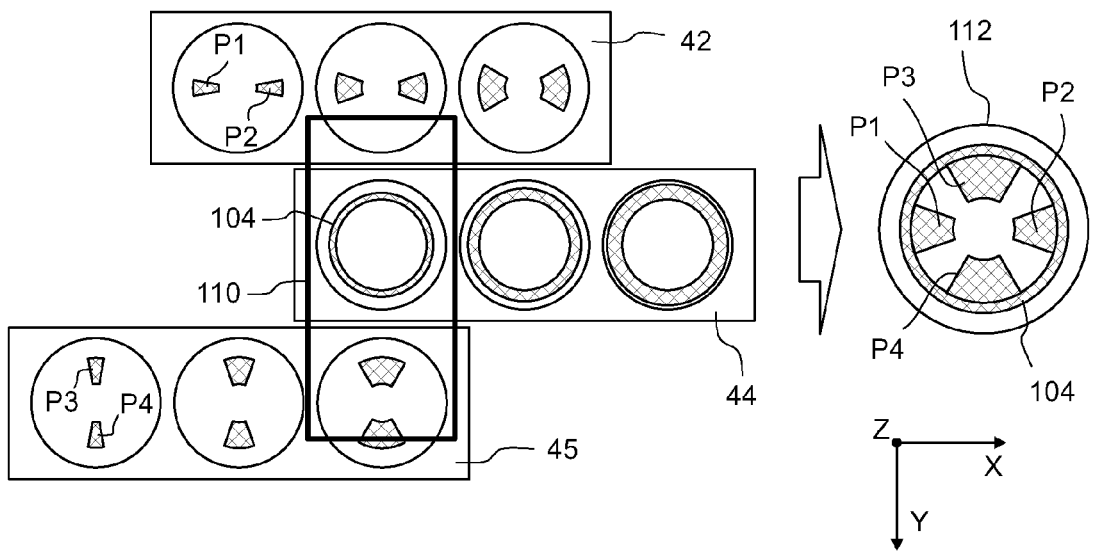
FIG. 10 is a top view on three diffractive optical elements if viewed along the optical axis in a specific mutual arrangement according to a fourth embodiment.

FIG. 10 shows, in a representation similar to FIG. 5, a fourth embodiment in which not only two, but three different diffractive optical elements 42, 44, 45 are arranged in one plane or in parallel planes so that they do not overlap.

In this embodiment the first and the second diffractive optical element 42, 44 have the same optical properties as it has been explained above with reference to FIGS. 3 and 4.

The third diffractive optical element 45 produces in the far field, depending on the position where the light beam 34 impinges, the same arrangement of poles P1, P2 as the first diffractive optical element 42, but rotated by 90°. With the three diffractive optical elements 42, 44, 45 it is then possible to produce combined irradiance distributions 112 with four poles P1, P2, P3, P4 and an outer annulus 104. However, the pole width angle α of the poles P1, P2 arranged along the X direction and of the poles P3, P4 arranged along the Y direction can be independently varied by displacing the first and the third diffractive optical element 42, 45 along the X direction.

If additionally the arrangement of the diffractive optical elements 42, 44, 45 relative to the light field 110 is changed along the Y direction, the energy ratio between the poles P1, P2 extending along the X direction and the poles P3, P4 extending along the Y direction changes.

c) Overlapping Diffractive Optical Elements

Figure 11:
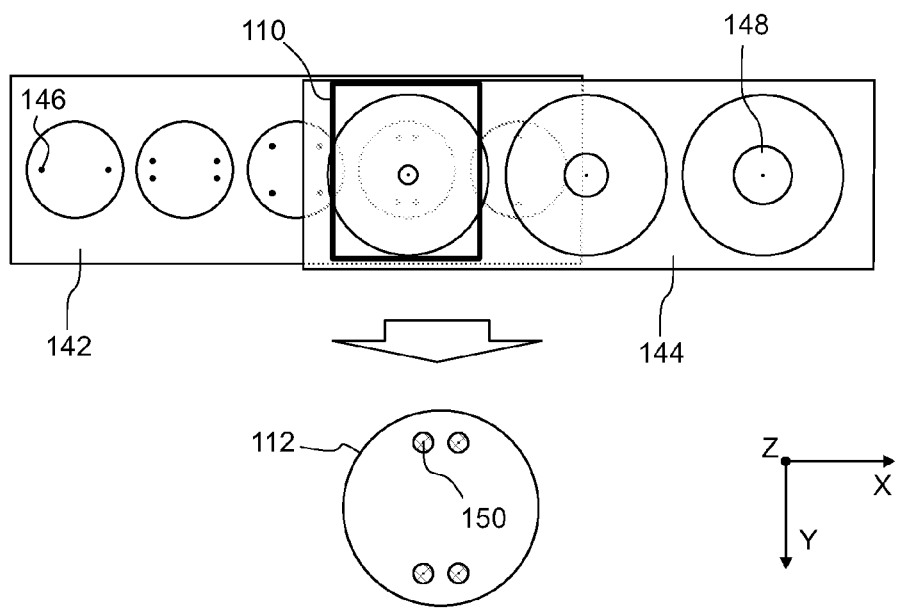
FIG. 11 is a top view on two overlapping diffractive optical elements according to a fifth embodiment if viewed along the optical axis.

FIG. 11 is a schematic top view of a first and a second diffractive optical element 142, 144 according to a fifth embodiment. Unlike the embodiments described above, the diffractive optical elements 142, 144 are arranged in different parallel planes so that they at least partly overlap. Then the projection light beam 34 passes subsequently through the first and then through the second diffractive optical element 142, 144. The combined irradiance distribution 112 may in this case be described as a convolution of the far field spatial irradiance distributions produced by the first and by the second diffractive optical element 142, 144.

In the specific configuration shown in FIG. 11 it is assumed that the first diffractive optical element 142 produces a plurality of small dots 146 whose number and/or positions depend on the X position of the light field 110 on the first diffractive optical element 142. The second diffractive optical element 144 is assumed to produce in the far field a single central spot 148 having a circular boundary line. The diameter of the spot increases depending on the X position where light diffracted by the first diffractive optical element 142 impinges on the second diffractive optical element 144.

By convoluting the two spatial irradiance distributions it is possible to produce varying patterns of spots or poles 150 in the pupil plane 84. The pole pattern is determined by the X position of the first diffractive optical element 142, and the pole diameter is determined by the X position of the second diffractive optical element 144.

d) Beam Oscillation Compensation

Figure 12A:
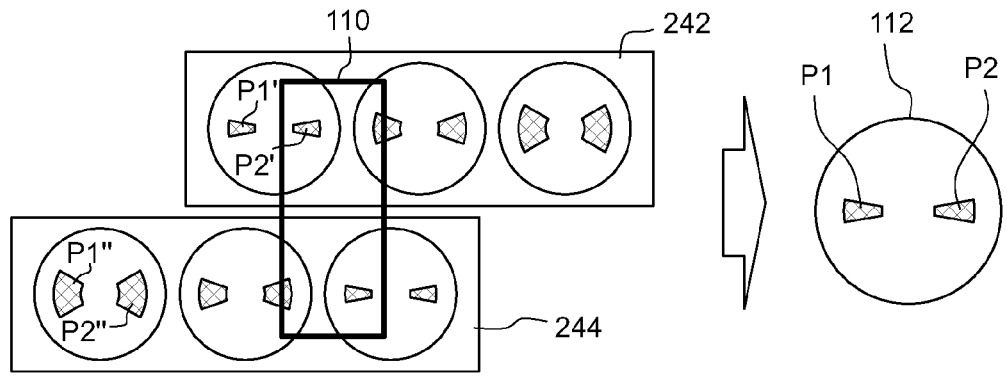
FIGS. 12a to 12c are top views on two diffractive optical elements according to a sixth embodiment in which the diffractive optical elements have diffractive effects with a mirror symmetrical position dependence.

FIG. 12a is a top view, similar to the representation shown in FIG. 5, on two diffractive optical elements 242, 244 according to a sixth embodiment.

This embodiment differs from the first embodiment shown in FIGS. 2 to 6 mainly in that the second diffractive optical element 244 does not produce different annuli in the far field, but the same poles as the first diffractive optical element 242. However the directional dependence is mirror symmetrically reversed. More specifically, if the position of the light field 110 shown in FIG. 12a moves to the right, the size of the poles P1', P2' produced by the first diffractive optical element 242 increases, and the size of the poles P1", P2" produced by the second diffractive optical element 244 decreases. This may simply be accomplished by producing two identical diffractive optical elements, but mounting one of them after rotating it by 180° around an axis that is parallel to the optical axis OA.

Figure 12B:
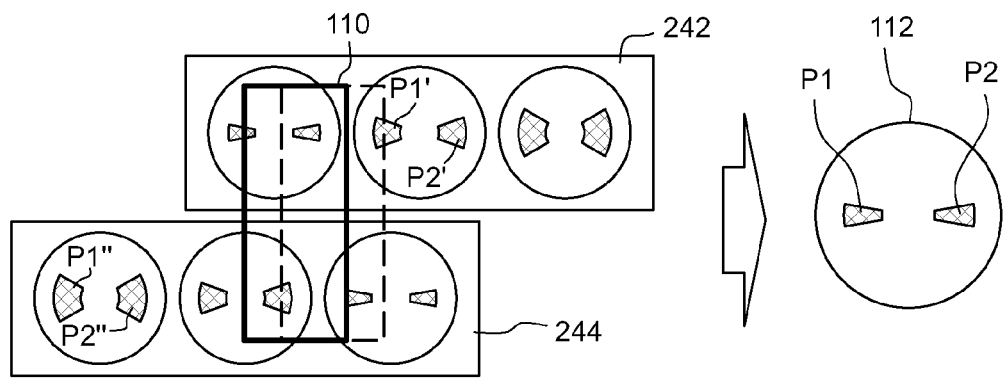

With such a configuration of the first and the second diffractive optical element 242, 244 the combined irradiance distribution 112 will be at least approximately independent of the position of the light field 110 of the first and the second diffractive optical element 242, 244. This is illustrated in FIG. 12b which shows how the light field 110 irradiates the diffractive optical elements 242, 244 at an X position shifted to the left. The first diffractive optical element 242 then produces smaller poles P1', P2', but this is compensated by the second diffractive optical element 244 which produces larger poles P1", P2". The poles P1, P2 of the combined far field irradiance distribution 112 then have a size which is halfway in between the size of the poles P1', P2' and the size of the poles P1", P2".

Figure 12C:
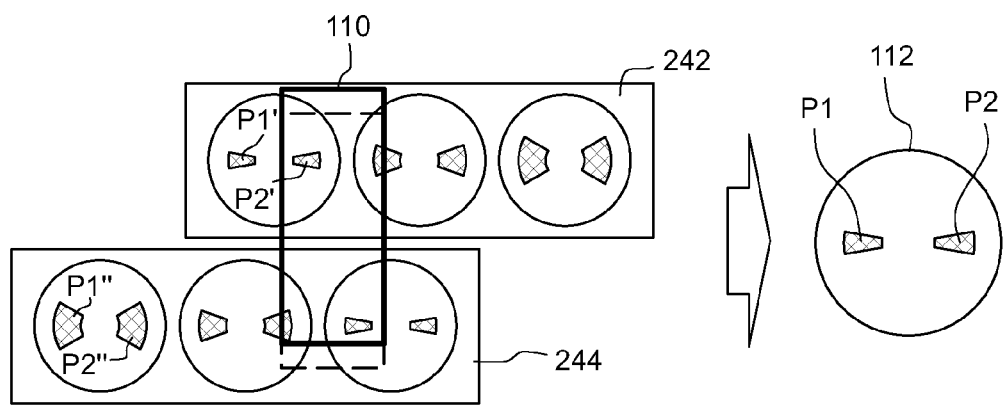

As it is shown in FIG. 12c, also the position of the light field 110 along the Y direction does not affect the combined irradiance distribution 112. This is because both diffractive optical elements 242, 244 direct light to the same poles, and thus both poles P1, P2 in the combined irradiance distribution 112 receive the same amount of light irrespective of the Y position of the light field 110 with respect to the arrangement of the diffractive optical elements 242, 244.

Such an independence of the combined irradiance distribution 112 of the position of the light field 110 on the diffractive optical elements 242, 244 is advantageous in those cases in which it is difficult to spatially stabilize the projection light beam 34 when it impinges on the pupil defining unit 40. Such undesired time dependent variation of the beam position may be a result of certain drift effects in the light source 30 which are greatly amplified by the long distance between the light source 30 and the pupil defining unit 40 (usually several or even up to 20 meters). Then the proposed arrangement of identical diffractive optical elements 242, 244 ensures that the combined irradiance distribution 112 in the pupil plane 84 is not significantly affected by such undesired oscillations of the light field 110.

Nevertheless it is possible to modify the pole width angle α by changing the mutual spatial arrangement of the first and the second diffractive optical element 242, 244 with the help of the first and the second driver 54, 64.

VII. Method Steps

Figure 13:
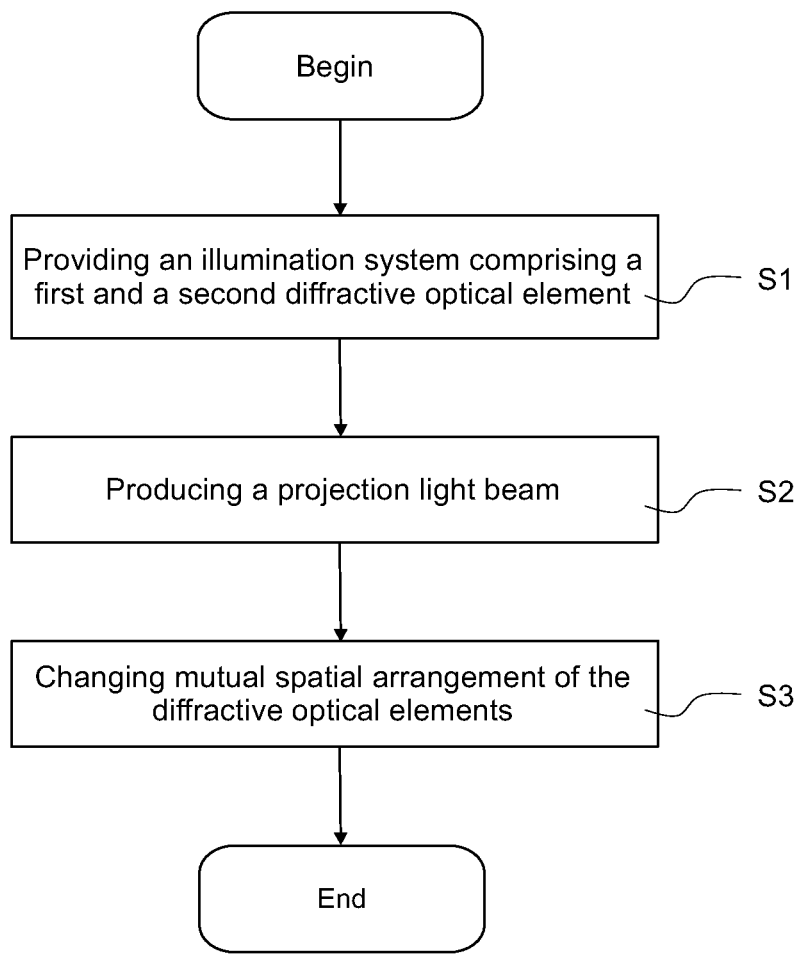
FIG. 13 is a flow diagram that illustrates important method steps.

In the following important method steps of the disclosure will be summarized with reference to the flow diagram shown in FIG. 13.

In a first step S1 an illumination system is provided that includes a first and the second diffractive optical element. In a second step S2 a projection light beam is produced. In a third step S3 the mutual spatial arrangement of the diffractive optical elements is changed.

What is claimed is:

1. An illumination system, comprising:
a light source configured to produce projection light;
a first diffractive optical element;
a second diffractive optical element; and
a displacement mechanism configured to change a relative spatial arrangement of the first and second diffractive optical elements,
wherein:
the first and second diffractive optical elements are between the light source and a pupil plane of the illumination system so that an irradiance distribution of the projection light in the pupil plane depends on diffractive effects produced by the first and second diffractive optical elements;
for each of the first and second diffractive optical elements, the diffractive effect produced by the diffractive optical element continuously varies if a position of a light field of the projection light on an effective region of the diffractive optical element changes continuously;
in at least one relative spatial arrangement of the first and second diffractive optical elements obtainable via the displacement mechanism, the light field extends over both the first and the second diffractive optical elements;
the light field has a first area extending over the first diffractive optical element having a first area;
the light field has a second area extending over the second diffractive optical element; and the first and second areas are different; and the illumination system is a microlithographic illumination system.

2. The illumination system of claim 1, wherein the displacement mechanism is configured to displace at least one of the first and second diffractive optical elements along a direction which is not parallel to an optical axis of the illumination system.

3. The illumination system of claim 2, wherein the diffractive effect produced by the at least one diffractive optical element varies, depending on the position of the light field, along the displacement direction.

4. The illumination system of claim 1, wherein the first and the second diffractive optical elements extend in the same plane.

5. The illumination system of claim 1, wherein the first and second diffractive optical elements extend in parallel planes.

6. The illumination system of claim 1, wherein an arrangement of the first and second diffractive optical elements is changeable relative to the projection light beam along two orthogonal directions that do not include an optical axis of the illumination system.

7. The illumination system of claim 1, further comprising a beam steering device configured to change a position of the light field.

8. The illumination system of claim 1, further comprising a third diffractive optical element.

9. The illumination system of claim 8, wherein the light field extends over each of the first, second and third diffractive optical elements.

10. The illumination system of claim 1, wherein the effective region is a region comprising diffractive structures that are configured to diffract impinging light.

11. An apparatus, comprising:
an illumination system according to claim 1; and
a projection objective,
wherein the apparatus is a microlithographic projection exposure apparatus.

12. An illumination system, comprising:
a light source configured to produce projection light;
a first diffractive optical element;
a second diffractive optical element; and
a displacement mechanism configured to change a relative spatial arrangement of the first and second diffractive optical element,
wherein:
the first and second diffractive optical elements are between the light source and a pupil plane of the illumination system so that an irradiance distribution of the projection light in the pupil plane depends on diffractive effects produced by the first and second diffractive optical elements;
wherein the first and second diffractive optical elements extend in a single plane or in different planes such that light impinging on the first diffractive optical element does not impinge on the second diffractive optical element, and vice versa;
for each of the first and second diffractive optical elements, the diffractive effect produced by the diffractive optical element depends on a position of a light field that is irradiated by the projection light on the diffractive optical element;
in at least one relative spatial arrangement of the first and second diffractive optical elements obtainable via the displacement mechanism, the light field extends over both the first and the second diffractive optical elements;
the light field has a first area extending over the first diffractive optical element having a first area;
the light field has a second area extending over the second diffractive optical element;
the first and second areas are different; and
the illumination system is a microlithographic illumination system.

13. The system of claim 12, wherein the displacement mechanism is configured to displace at least one of the first and second diffractive optical elements along a linear direction which is not parallel to an optical axis of the illumination system.

14. The system of claim 13, wherein the displacement mechanism is configured to displace the first diffractive optical element and the second diffractive optical element in parallel linear directions.

15. An apparatus, comprising:
an illumination system according to claim 12; and
a projection objective,
wherein the apparatus is a microlithographic projection exposure apparatus.

16. A method, comprising:
changing an irradiance distribution in a pupil plane of a microlithographic illumination system by changing a relative spatial arrangement of first and second diffractive optical elements with respect to a light field of the projection light that extends over both the first and second diffractive optical elements, wherein:
the first and second diffractive optical diffractive elements being in the microlithographic illumination system upstream of the pupil plane;
for each of the first and second diffractive optical elements, the diffractive effect produced by the diffractive optical element continuously varies if a position of a light beam on an effective region of the diffractive optical element changes continuously;
the light field has a first area extending over the first diffractive optical element having a first area;
the light field has a second area extending over the second diffractive optical element; and
the first and second areas are different.

17. The method of claim 16, wherein the effective region is a region comprising diffractive structures that are configured to diffract impinging light.

18. The method of claim 16, wherein light impinging on the first diffractive optical element does not impinge on the second diffractive optical element.

19. The method of claim 16, wherein changing the relative spatial arrangement of the first and second diffractive optical elements with respect to the light field comprises displacing the first and second diffractive optical elements along parallel linear direction.

* * * * *

UNITED STATES PATENT AND TRADEMARK OFFICE
CERTIFICATE OF CORRECTION

PATENT NO. : 9,477,157 B2
APPLICATION NO. : 14/696653
DATED : October 25, 2016
INVENTOR(S) : Michael Patra et al.

Page 1 of 1

It is certified that error appears in the above-identified patent and that said Letters Patent is hereby corrected as shown below:

In the Specification

Column 8, Line 65, delete "NA·a," and insert -- $NA \cdot a,$ --.

Column 8, Line 66, delete "a" and insert -- $a$ --.

Column 16, make Lines 56-67 a continuation of the same paragraph on Line 55.

Signed and Sealed this
Twenty-fifth Day of April, 2017

Michelle K. Lee
*Director of the United States Patent and Trademark Office*